US 8,448,119 B1

(12) United States Patent
Gordin et al.

(10) Patent No.: US 8,448,119 B1
(45) Date of Patent: May 21, 2013

(54) METHOD AND SYSTEM FOR DESIGN AND MODELING OF VERTICAL INTERCONNECTS FOR 3DI APPLICATIONS

(75) Inventors: Rachel Gordin, Hadera (IL); David Goren, Nesher (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/478,127

(22) Filed: May 23, 2012

(51) Int. Cl.
*G06F 17/50* (2006.01)
(52) U.S. Cl.
USPC .......................................... 716/122; 716/123
(58) Field of Classification Search
USPC ................................................. 716/118–125
See application file for complete search history.

(56) References Cited

U.S. PATENT DOCUMENTS

| | | | | |
|---|---|---|---|---|
| 6,665,849 | B2 * | 12/2003 | Meuris et al. | 716/134 |
| 6,816,999 | B2 * | 11/2004 | Lee | 716/134 |
| 7,454,733 | B2 | 11/2008 | Alon et al. | |
| 7,986,042 | B2 | 7/2011 | Or-Bach et al. | |
| 2005/0240883 | A1 * | 10/2005 | Huang et al. | 716/1 |
| 2011/0046767 | A1 | 2/2011 | Scheffer et al. | |

OTHER PUBLICATIONS

Bernstein et al, "Interconnects in the Third Dimension: Design Challenges for 3D ICs", IEEE DAC'07, San Diego, CA, USA, Jun. 4-8, 2007.
Goren et al., "An Interconnect-Aware Methodology for Analog and Mixed Signal Design", Based on High Bandwidth (Over 40 GHz) On-chip Transmission Line Approach, Date02, Paris 2002.
Goren et al, "On-chip Interconnect-Aware Design and Modeling Methodology, Based on High Bandwidth Transmission Line Devices", Proceedings Design Automation Conference, Anaheim, CA, Jun. 2-6, 2003.
Gordin et al, "Study of Coplanar Transmission Lines over the Lossy Silicon Substrate", SPI'03, Siena, May 2003.
Goren et al, "Modeling Methodology for On-Chip Coplanar Transmission Lines over the Lossy Silicon Substrate", SPI'03, Siena, May 2003.
Goren et al, "The Closed Environment Concept in VLSI On-Chip Transmission Lines Design and Modeling", IEEE Workshop on Signal Propagation on Interconnects, Berlin, May 9-12, 2006.
Eid et al., "Predictive High Frequency effects of substrate coupling in 3D integrated circuits stacking", IEEE International Conference on 3D System Integration 3DIC 2009, San Francisco, CA, Sep. 28-30, 2009.
Cadix et al., "Modelling of Through Silicon Via RF performance and impact on signal transmission in 3D integrated circuits", IEEE International Conference on 3D System Integration 3DIC 2009, San Francisco, CA, Sep. 28-30, 2009.
Harold A. Wheeler, "Formulas for the Skin Effect", Proceedings of the I.R.E.,vol. 30, Issue 9, pp. 412-423, Sep. 1942.

(Continued)

*Primary Examiner* — Binh Tat
(74) *Attorney, Agent, or Firm* — Howard Zaretsky

(57) ABSTRACT

A system and method for design and modeling of vertical interconnects for 3DI applications. A design and modeling methodology of vertical interconnects for 3DI applications includes models that represent the frequency dependent behavior of vertical interconnects by means of multi-segment RLC scalable filter networks. The networks allow for accuracy versus computation efficiency tradeoffs, while maintaining correct asymptotic behavior at both high and low frequency limits. In the framework of the model it is shown that a major effect is pronounced frequency dependent silicon substrate induced dispersion and loss effects, which is considered in through silicon via (TSV) parallel Y-element parameters, including capacitance and conductance.

19 Claims, 9 Drawing Sheets

OTHER PUBLICATIONS

Andry et al., "A CMOS—compatible Process for Fabricating Electrical Through-vias in Silicon", Proceeding of the IEEE 56th Electronic Components and Technology Conference, 2006.

Gordin et al., "Design and Modeling Methodology of Vertical Interconnects for 3DI Applications", IEEE Transactions on Advanced Packaging, published in Feb. 2011.

* cited by examiner

METHOD AND SYSTEM FOR DESIGN AND MODELING OF VERTICAL INTERCONNECTS FOR 3DI APPLICATIONS

FIELD OF THE INVENTION

The present invention relates to the field of integrated circuit design, and more particularly relates to a method and system for design and modeling of vertical interconnects for 3DI applications.

BACKGROUND OF THE INVENTION

In integrated circuit design, a through-silicon via (TSV) is a vertical electrical connection (via) passing completely through a silicon wafer or die. TSVs are a high performance technique currently used to create 3D packages and 3D integrated circuits, compared to alternatives such as package-on-package, because the density of the vias is substantially higher, and because the length of the connections is shorter.

A three dimensional integration (3DI) package contains two or more chips (integrated circuits) stacked vertically so that they occupy less space and/or have greater connectivity. An alternate type of 3D package can be found, for example, in IBM's Silicon Carrier Packaging Technology, where ICs are not stacked but a carrier substrate containing TSVs is used to connect multiple ICs together in a package. In most 3D packages, the stacked chips are wired together along their edges; this edge wiring slightly increases the length and width of the package and usually requires an extra "interposer" layer between the chips. In some 3D packages, through-silicon vias replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking).

An example priori art 3D integrated circuit is shown in FIG. 1. The integrated circuit, generally referenced 70, is constructed by stacking multiple silicon wafers and/or dies 72 and interconnecting them vertically so that they behave as a single device. By using TSV technology, 3D ICs can pack a great deal of functionality into a small "footprint." The different dice in the stack may be heterogeneous, e.g., combining CMOS logic, DRAM and III-V materials into a single IC. In addition, critical electrical paths through the device can be drastically shortened, leading to faster operation.

Improvements in IC technology are leading to continued increases in IC operating speeds. For example, recent technology offers a tremendous increase in on-chip signal bandwidth in the areas of analog and mixed signal (AMS) design, providing operating speeds in the region of tens of Gigahertz. As operating speeds reach the multi-Gigahertz range, on-chip interconnect lines and TSVs, i.e. wires connecting circuit components on the same or different chip levels, can have a major impact on IC performance. High speed design is characterized by a frequent need for true-transient time-domain simulations, high importance of signal integrity, and characteristic bandwidths in the microwave region. Thus a consideration of on-chip interconnect line and TSV effects becomes necessary. Moreover, early incorporation of interconnects and TSVs in the design process is highly desirable because a traditional post-layout treatment of on-chip interconnects and TSVs can lead to numerous design iterations or a significant amount of over-design.

The three-dimensional integration (3DI) chip technology concept offers a potential for improving systems performance in addition to the planar technology scaling, which is now experiencing a considerable drop in performance improvement per node.

Building viable systems of stacked chips with very high density vertical interconnections is impossible without means which enable precise prediction of the expected 3DI circuitry behavior. Preferably, the solution should model both horizontal and vertical interconnects with high accuracy for both AMS and digital design in an actual design environment, including silicon substrate, surrounding vertical and horizontal interconnect, etc. In addition, it should be simple to operate, fast, consider technology specifics (e.g., BEOL, FEOL, inter-strata dielectric structure, etc.), support different simulation both in time and frequency domain, and be fully integrated within common design flows and environments.

SUMMARY OF THE INVENTION

The present invention is a design and modeling methodology for interconnects for 3DI designs. The vertical interconnect-aware design methodology comprises of identifying critical vertical interconnects at early stages of the design flow, their modeling and incorporation into the netlist as "vertical transmission line (T-line) devices". These vertical T-line devices are of predefined topologies consisting of single-signal and multi-signal structures. Each topology is designed to meet closed environment conditions, enabling high predictability of the behavior of critical interconnects. T-line devices are supplied as parameterized schematic and layout cells (e.g., P-cells), together with their simulation models, as an integral part of given silicon chip technology design methodology. The invention provides a design and modeling methodology for interconnects in 3DI design, as well as for modeling specific 3DI vertical interconnect elements.

There is thus provided in accordance with the invention, a method of designing an integrated circuit, the method comprising defining a preliminary design of the integrated circuit, identifying critical vertical interconnects in the preliminary design, defining vertical transmission line model to represent each critical vertical interconnect, the transmission line model based on a closed environment, defining a layout design of the integrated circuit, comprising circuit components and parameters thereof, using the preliminary design and the transmission line model for each critical vertical interconnect and extracting circuit component parameters from the layout design for simulation of the design using the extracted circuit component parameters.

There is also provided in accordance with the invention, an integrated circuit design system, comprising means for defining a preliminary design of the integrated circuit, means for identifying critical vertical interconnects in the preliminary design, means for defining a vertical transmission line model to represent each critical vertical interconnect, the transmission line model based on a closed environment, means for defining a layout design of the integrated circuit, comprising circuit components and parameters thereof, using the preliminary design and the transmission line model for each critical vertical interconnect and means for extracting circuit component parameters from the layout design for simulation of the design using the extracted circuit component parameters.

There is further provided in accordance with the invention, a computer program product comprising a computer readable medium having embodied therein computer readable program code means for causing a computer to implement an integrated circuit design system, comprising computer readable program code means for defining a preliminary design of the integrated circuit, computer readable program code means for identifying critical vertical interconnects in the preliminary design, computer readable program code means for defining a vertical transmission line model to represent each critical vertical interconnect, the transmission line model based on a closed environment, computer readable program code means for defining a layout design of the integrated circuit, comprising circuit components and parameters thereof, using the preliminary design and the transmission line model for each critical vertical interconnect and computer readable program code means for extracting circuit component parameters from the layout design for simulation of the design using the extracted circuit component parameters.

BRIEF DESCRIPTION OF THE DRAWINGS

The invention is herein described, by way of example only, with reference to the accompanying drawings, wherein.

DETAILED DESCRIPTION OF THE INVENTION

Figure 1:
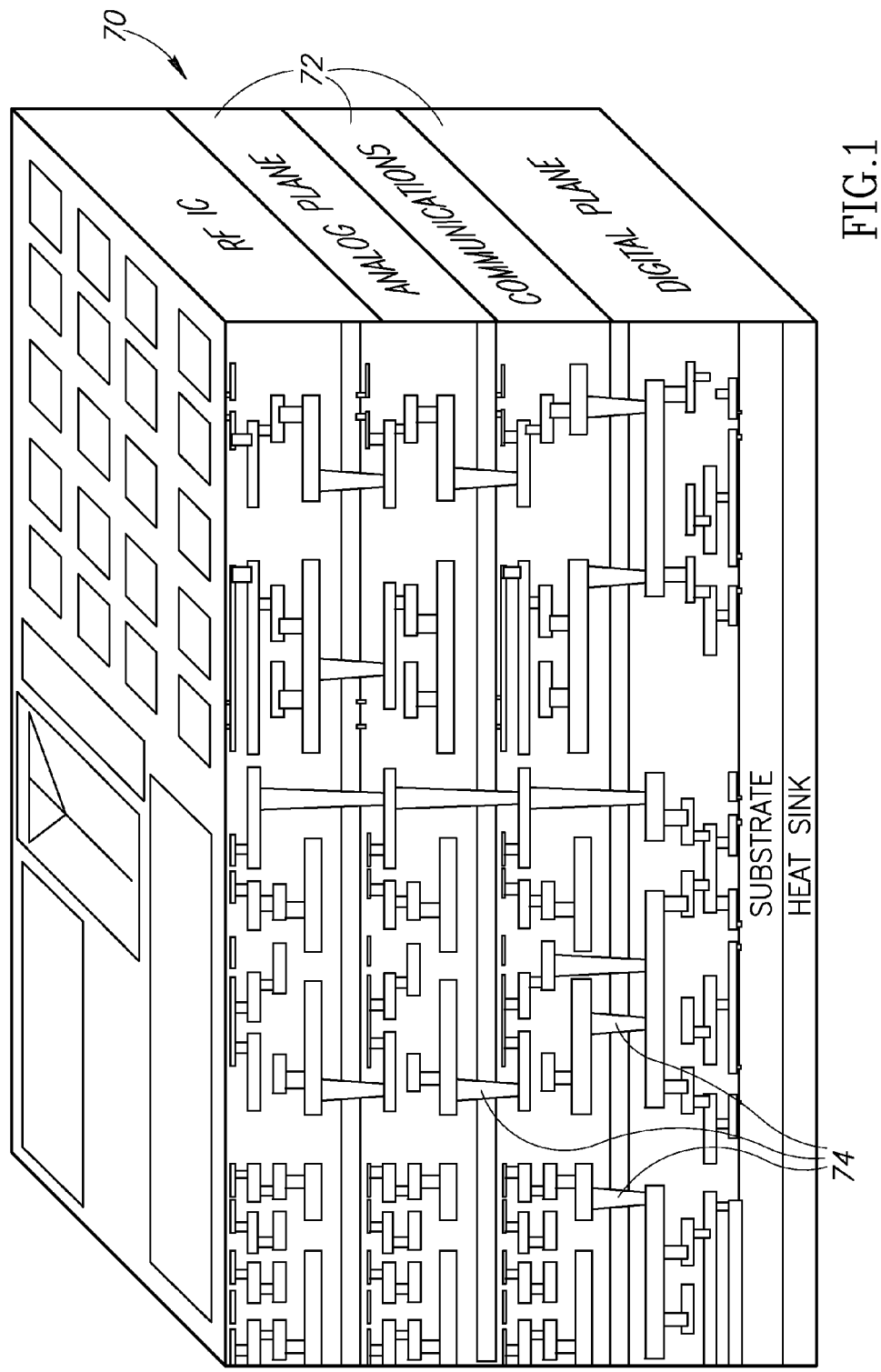
FIG. 1 is a diagram illustrating an example prior art 3D multi-chip stack scheme.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that performs particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device.

Computer program code for carrying out operations of the present invention may be written in any combination of one or more programming languages, including an object oriented programming language such as Java, Smalltalk, C++, C# or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

Figure 2:
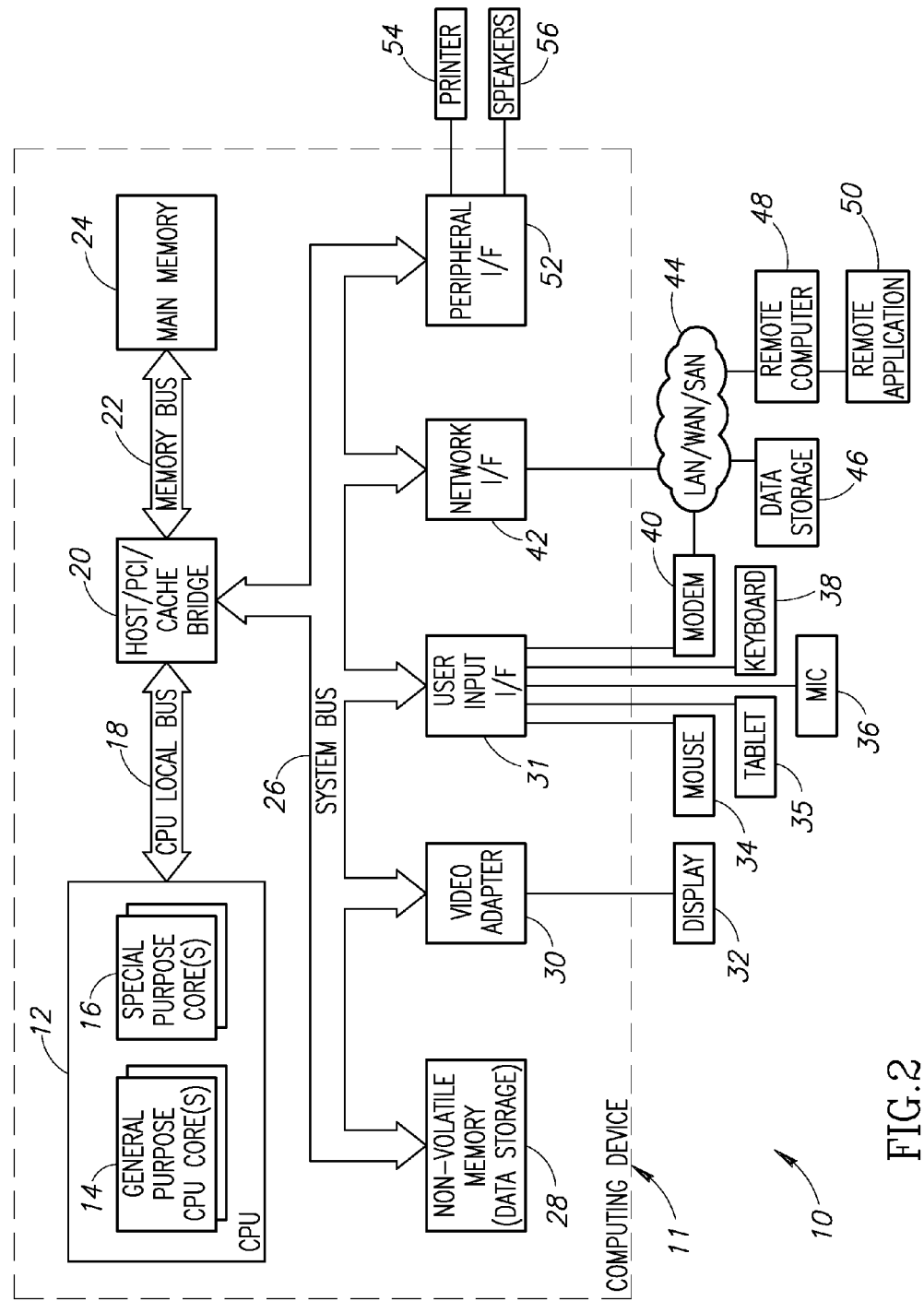
FIG. 2 is a block diagram illustrating an example computer processing system adapted to implement the system of the present invention.

A block diagram illustrating an example computer processing system adapted to implement the system of the present invention is shown in FIG. 2. The exemplary computer processing system, generally referenced 10, for implementing the invention comprises a general purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, etc.). The one or more general purpose cores execute general purpose opcodes while the special purpose cores executes functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 2 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

3DI Design and Modeling Methodology

As shown in FIG. 1, in 3DI technology vertical interconnects 74 provide electrical connectivity between multiple stacked chips also called strata 72. The strata mounting may be performed face-to-face or face-to-back. In either case, in order to provide electrical connections between the package and the active devices, as well as between the active devices of adjacent strata, there preferably should be connections through the silicon. Therefore, an enabling technology element required for 3D integration is the through-silicon via or TSV.

Figure 3:
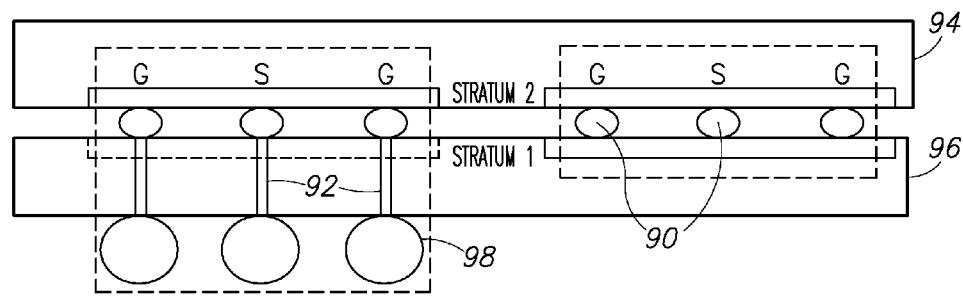
FIG. 3 is a diagram illustrating example TSVs and micro-bumps.

A diagram illustrating example TSVs and micro-bumps is shown in FIG. 3. Two strata 94 and 96 are shown with TSVs 92 and micro-bumps 90. In the left side group of TSVs, the center signal TSV is surrounded by ground TSVs. Similarly, in the right side group of micro-bumps, the center signal micro-bump is surrounded by ground micro-bumps. In one embodiment, tungsten (W) or copper (Cu) is used to construct the TSV, with either bar, cylindrical or annular TSVs covered by the oxide liner (also referred to as dielectric barrier) which isolates the TSV metal from the silicon.

The TSV length, cross section shape and dimensions, as well as the liner thickness, are limited by the capabilities of a chosen technology. The height of the TSV can vary from a few microns to about 100 um, which is the sum of silicon thickness (greater than 80%), BEOL thickness (approximately 10%), and FEOL thickness (less than 10%). In some structures, the TSV is relatively thick, i.e. the length to diameter aspect ratio is usually less than 10:1, which implies that it cannot be regarded it as a long thin structure. The oxide liner thickness to diameter ratio is less than 0.05.

In one embodiment, the placement of TSVs is organized into an array, or TSV farm, occupying a relatively large part of the silicon area, with the TSV farm pitch generally no less than two TSV diameters. Each farm is surrounded by grounded TSVs for two reasons: (1) to make the farm electromagnetically well-defined such that to guarantee closed environment conditions; and (2) to prevent substrate crosstalk to and from the TSV farm.

An additional element required for 3D integration is a bonding structure between interconnects of adjacent strata. One technique for such bonding uses C4-like "bumps" (referred to as 'mini-C4s') immersed in an underfill material which is a good dielectric (k=3 to 4). A mini-C4 diameter is smaller than that of a C4. The mini-C4s are also arranged in farms, whose density may differ from that of the TSV farms. A signal TSV and a signal mini-C4 are considered as two separate vertical interconnect elements requiring separate models, and build the respective interconnect devices based on the concept of a "closed environment" which is a key component of the interconnect-aware design and modeling methodology of the present invention.

We define the closed environment of a given design structure as a design fragment including the structure itself (i.e. the "core structure"), and one or more additional design elements which affect its electrical behavior ("closed neighborhood"), such that the whole fragment can be accurately represented and simulated by a stand-alone, independent model of the core structure in the actual design environment. The "closed environment" concept has two interdependent aspects: (1) proper design, and (2) proper modeling. Proper design refers both to compliance with certain design rules which ensure the desired electrical behavior of the structure in a real design environment, and to a best design practice which ensures better performance and lower crosstalk. Proper modeling refers to the ability of stand-alone models to describe the electrical behavior of the properly designed structure in a real design environment.

Figure 4A:
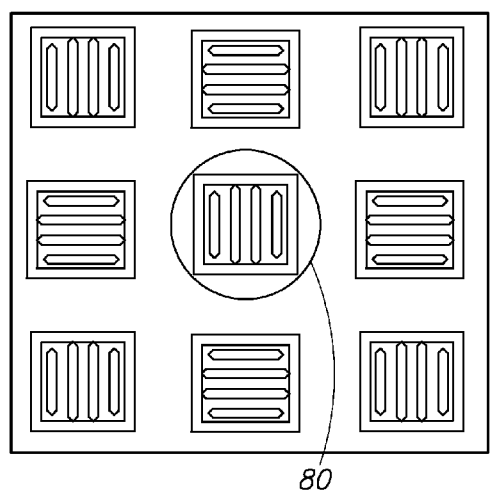
FIG. 4A is a diagram illustrating an example tungsten multi-bar TSV single-signal path within a farm.
Figure 4B:
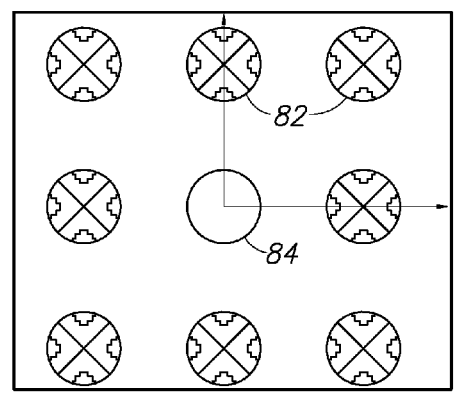
FIG. 4B is a diagram illustrating an example cylindrical or annual TSV single-signal path within a farm.
Figure 4C:
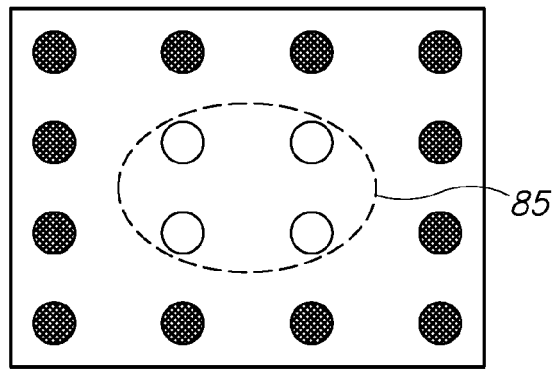
FIG. 4C is a diagram illustrating an example mini-C4, cylindrical or annual TSV multi-signal path within a farm.

Applied to the modeling of a vertical interconnect element (e.g., TSV, mini-C4) bearing a signal, the closed environment requires including in the model the adjacent surrounding vertical elements (i.e. neighbors). FIGS. 4A, 4B and 4C schematically show these neighbors for some example cases discussed herein. A diagram illustrating an example tungsten multi-bar TSV single-signal path 80 within a farm is shown in FIG. 4A. Note that a different number of bars may be considered, while keeping the same TSV farm pattern. A diagram illustrating an example mini-C4, cylindrical or annual TSV single-signal path 84 within a farm is shown in FIG. 4B. A diagram illustrating an example mini-C4 or TSV multi-signal path 85 within a farm is shown in FIG. 4C. If the signal path is critical, such as when connecting a high speed serial link core, or a carefully matched RF signal, then the neighbors 82 are preferably grounded, providing both reference potential and current return path. If some of the neighbors are not grounded, the vertical interconnect model considers them by either a worst case loading model or a full crosstalk model.

Modeling the BEOL portions of the 3D interconnects for each stratum is performed using transmission line models for critical lines and standard parasitic extraction for the remainder, which results in a comprehensive 3DI interconnect design and modeling methodology.

Figure 5:
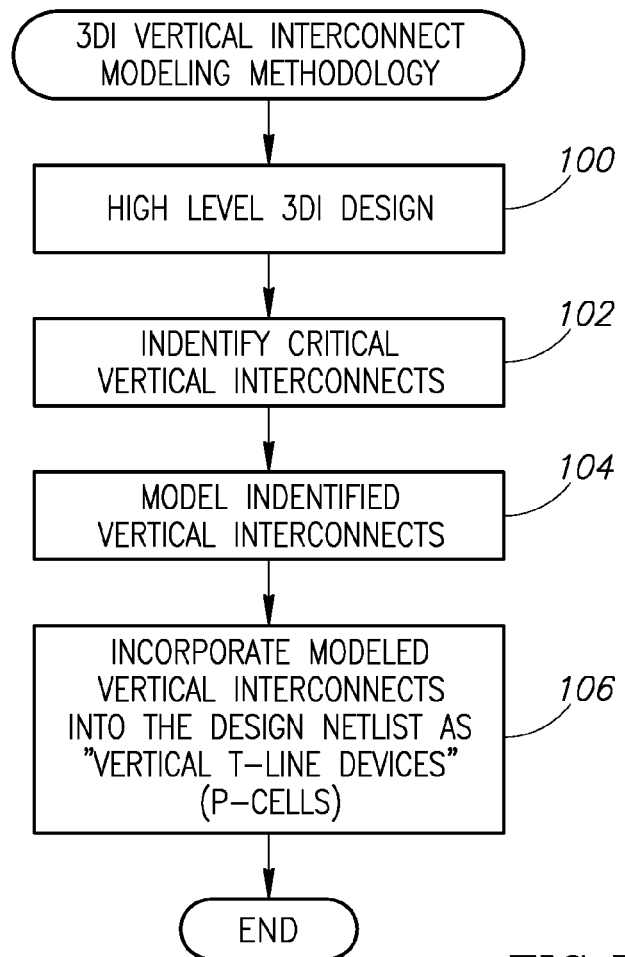
FIG. 5 is a flow diagram illustrating an example 3DI vertical interconnect modeling methodology.

A flow diagram illustrating an example 3DI vertical interconnect modeling methodology is shown in FIG. 5. For a given high level 3DI design (step 100), the vertical interconnect-aware design methodology comprises first identifying critical vertical interconnects at early stages of the design flow (step 102). The critical vertical interconnects identified are modeled (step 104) and the resulting models are incorporated into the netlist as "vertical transmission line (T-line) devices" (step 106). These vertical T-line devices are of predefined topologies consisting of single-signal and multi-signal structures. Each topology is designed to meet closed environment conditions, enabling high predictability of the behavior of critical interconnects. T-line devices are supplied as parameterized schematic and layout cells (i.e. P-cells), together with their simulation models, as an integral part of given silicon chip technology design methodology. The invention provides a design and modeling methodology for interconnects in 3DI design, as well as for modeling specific 3DI vertical interconnect elements.

Figure 6:
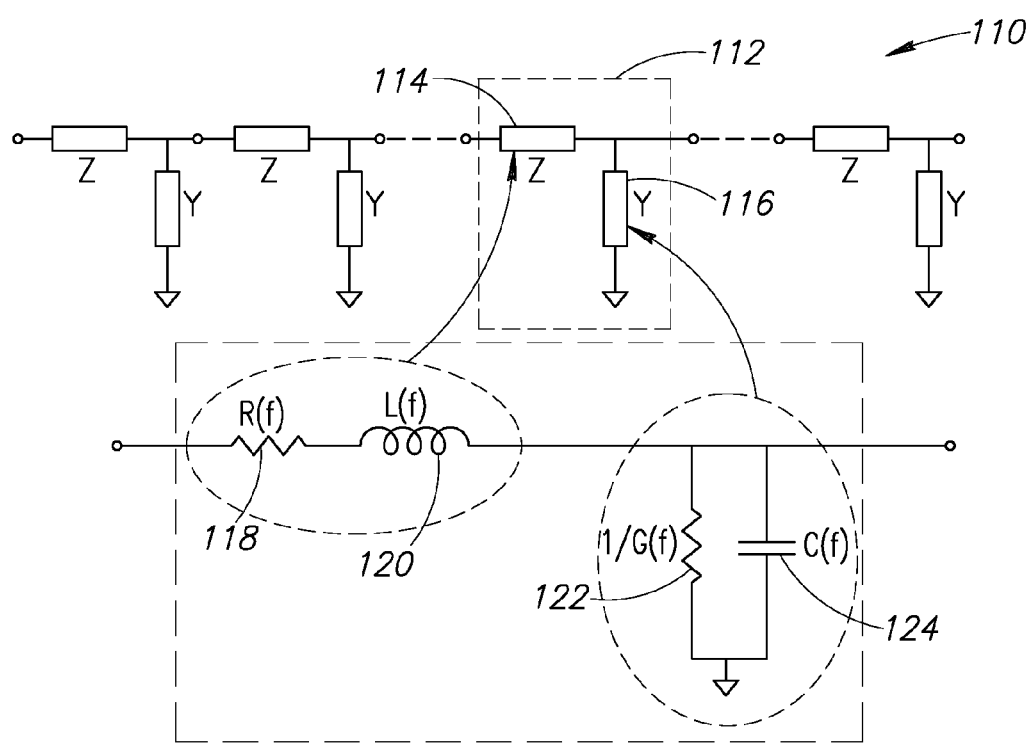
FIG. 6 is a diagram illustrating an example general frequency dependent representation of a vertical interconnect element for a distributed ZY-network.
Figure 7:
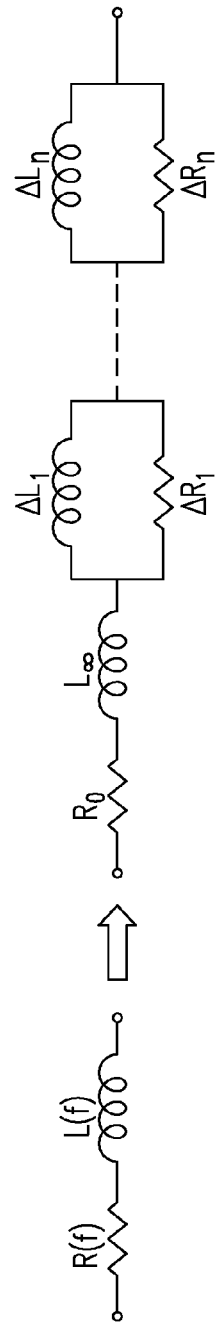
FIG. 7 is a diagram illustrating an example general frequency dependent representation of a vertical interconnect element for a Z-element network.
Figure 8:
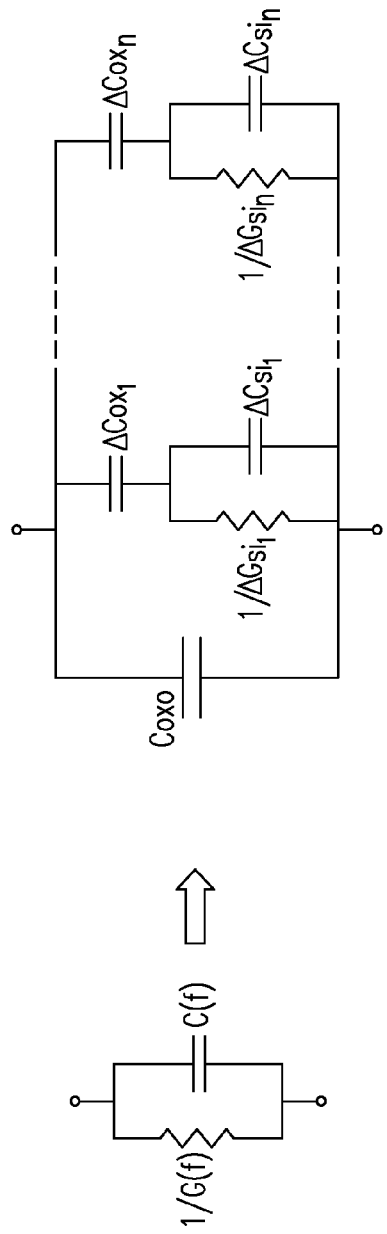
FIG. 8 is a diagram illustrating an example general frequency dependent representation of a vertical interconnect element for a Y-element network.

A diagram illustrating an example general frequency dependent representation of a vertical interconnect element for a distributed ZY-network is shown in FIG. 6. The ZY block 112 comprises a series Z 114 and parallel Y element. The modeling methodology of the present invention is based on breaking the electromagnetic problem into a serial magnetic problem and a parallel electric problem. The serial magnetic problem is for calculating the Z element, namely the resistance R(f) 118 and inductance L(f) 120. A diagram illustrating an example general frequency dependent representation of a vertical interconnect element for a Z-element network is shown in FIG. 7. The parallel electric problem is for calculating the Y element, namely capacitance C(f) 124 and conductance G(f) 122. A diagram illustrating an example general frequency dependent representation of a vertical interconnect element for a Y-element network is shown in FIG. 8. This division, while known to be possible for the case of low loss substrates, can be generalized at certain conditions also for the case of high loss silicon substrates, as shown below.

In one embodiment, it is preferable in a 3DI system that the TSV/mini-C4 diameter, as well as the TSV/mini-C4 separation from its neighbors, be much smaller that the shortest wavelength in the given signal bandwidth. It is noted that the pronounced presence of the silicon gives rise to a slow wave effect which reduces the wavelength, and increases the intrinsic propagation time, across the TSV. The number of ZY segments is approximately 10-15 per effective wavelength, while considering the slow wave effect in the silicon. Therefore, the actual number of ZY segments for modeling a specific vertical interconnect element depends on its physical length. In one embodiment, the circuit level simulation models of Z and Y elements are implemented as filter networks composed of lumped frequency independent linear components shown in FIGS. 7 and 8.

Figure 9:
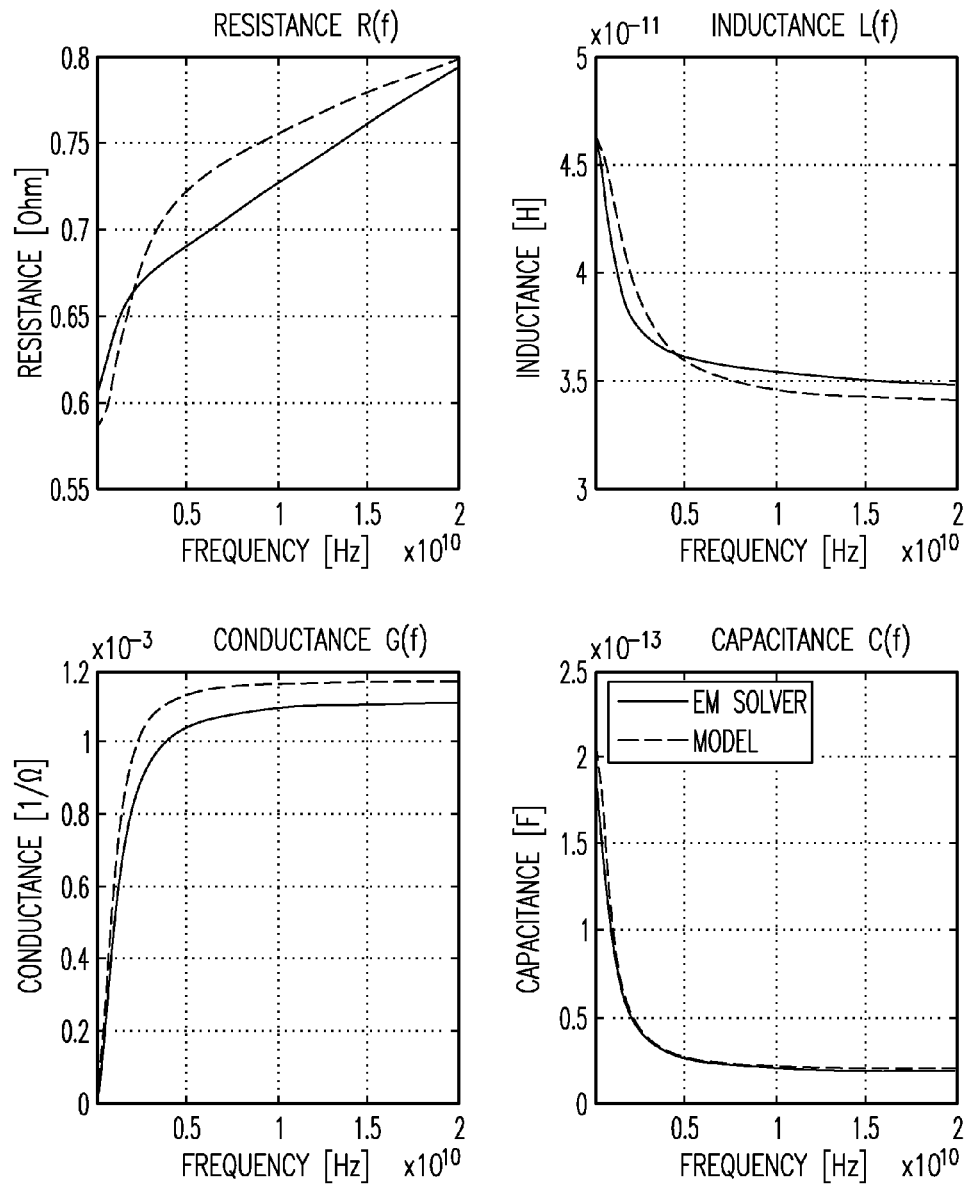
FIG. 9 is a diagram illustrating typical physical behavior of $R(f), L(f), F(f), C(f)$ for a TSV within a farm for the case of a one-bar tungsten TSV.
Figure 10:
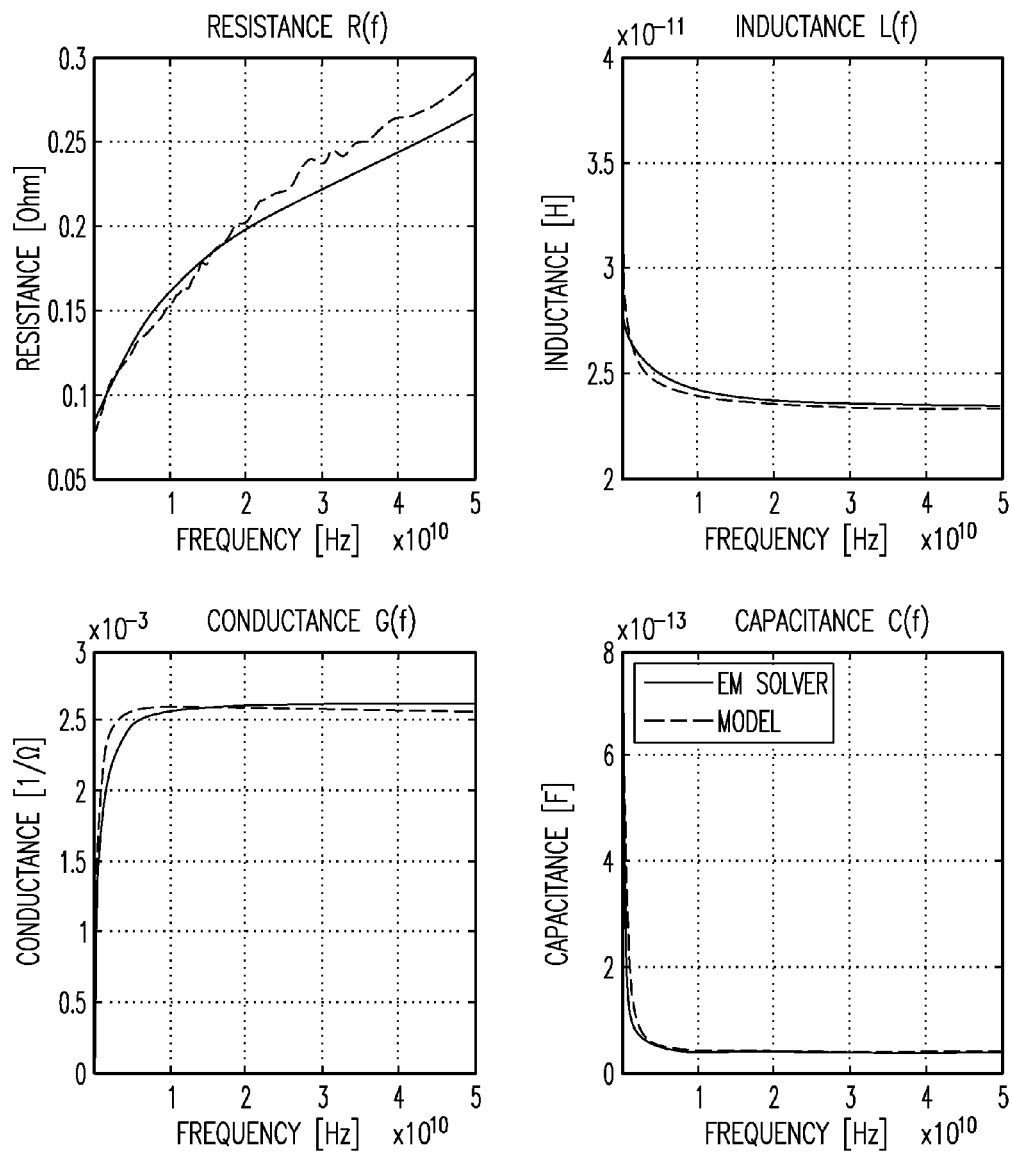
FIG. 10 is a diagram illustrating typical physical behavior of $R(f), L(f), F(f), C(f)$ for a TSV within a farm for the case of a four-bar tungsten TSV.
Figure 11:
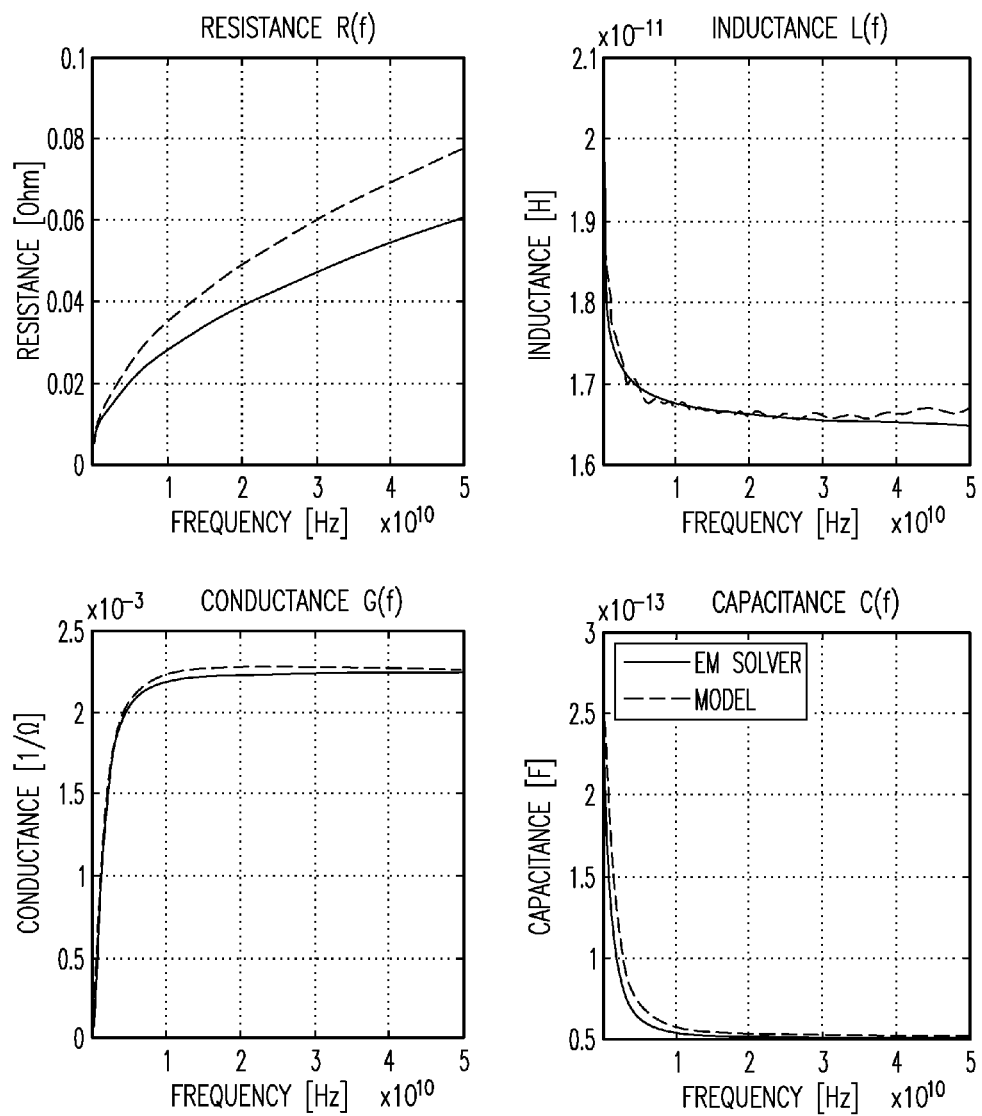
FIG. 11 is a diagram illustrating typical physical behavior of $R(f), L(f), F(f), C(f)$ for a TSV within a farm for the case of a copper annular TSV.

The requirement for the Z element network is to reconstruct the physical R(f) and L(f) behavior throughout the bandwidth of interest, including frequency dependent skin and proximity effects. FIGS. 9, 10 and 11 show typical physical behavior for R(f) and L(f) of a TSV within a farm, for several cases corresponding to FIGS. 4A and 4B, assuming fully grounded neighbors. The Z element behavior of the mini-C4 is similar and is therefore modeled using the same approach.

The frequency dependent behavior of the Z element is modeled using the multi-segment filter RL network as shown in FIG. 7. Closed form explicit expressions for the network components were derived using the high and low frequency asymptotic behavior of R(f) and L(f) and the transition frequency $F_c$, which are calculated independently. The example formulas for a single-signal TSV within array are shown below.

$$R(f) = rho * z / S_{eff}(f) * (1 + \frac{1}{8})$$

where rho is the TSV metal resistivity, z is the TSV length, $S_{eff}(f)$ is the TSV effective cross-section area defined by its shape and the frequency dependent skin depth $\delta = \sqrt{rho/(\pi * f * \mu_0)}$, such that $S_{eff}(0)$ is the whole cross-section area, and at high frequencies $S_{eff}(f) \sim 1/\sqrt{f}$.

$$L(0) = \mu_0 / (2 * \pi) * \ln(G_{sn}^2 / (G_s * G_n))$$

where $\mu_0$ is the vacuum permeability, $G_s$, $G_n$ and $G_{sn}$ are GMDs (geometric mean distances) of the signal TSV, the neighbor TSVs, and mutual GMD between signal and the neighbors.

$L(\infty) = \mu_0 * \epsilon_0 * k(Si) / C_{hf}$ where $\epsilon_0$ is the vacuum permittivity, k(Si) is the high frequency dielectric constant of the silicon, $C_{hf}$ is the high frequency capacitance of the structure, evaluated analytically or numerically.

Fc is the frequency at which the skin depth is comparable with the TSV relevant cross section dimensions, such as the radius of the cylindrical TSV.

The number of RL segments used depends on the physical length of the structure compared to the wavelength, while considering the slow wave effect.

The requirement for the Y element network is to reconstruct the physical C(f) and G(f) behavior throughout the full bandwidth of interest. The typical physical behavior of these parameters R(f), L(f), G(f), C(f) for a signal TSV within a farm for the case of fully grounded neighbors (model vs. solver), is described in FIGS. 9, 10 and 11. In particular, a diagram illustrating typical physical behavior of R(f), L(f), F(f), C(f) for a TSV within a farm for the case of a one-bar tungsten TSV is shown in FIG. 9. A diagram illustrating typical physical behavior of R(f), L(f), F(f), C(f) for a TSV within a farm for the case of a four-bar tungsten TSV is shown in FIG. 10. A diagram illustrating typical physical behavior of R(f), L(f), F(f), C(f) for a TSV within a farm for the case of a copper annular TSV is shown in FIG. 11.

Since the silicon is connected to ground by multiple substrate contacts, then, at low frequencies, it behaves like a perfectly grounded metal, yielding the maximal TSV static capacitance $C(0)=C_0$ and zero losses. The TSV static capacitance value is defined by the oxide liner thickness, and is not sensitive to the presence of its neighbors. At the high frequency limit, capacitance reaches its minimal value, $C(\infty) = C_\infty$, obtained by assuming that the silicon substrate behaves as a perfect dielectric (zero conductivity). The high frequency capacitance is defined by location of the neighboring TSVs. The parallel conductance, which represents the TSV signal loss due to the silicon, reaches its maximal value at the high frequency limit $G(\infty)=G_\infty$, which results in saturation losses in the silicon.

The strong frequency dependent silicon substrate induced dispersion and loss effects are due to the fact that TSVs are immersed within the silicon, with very thin oxide liner isolation between the TSV and the silicon bulk. When a fast signal is switched through a TSV, we first notice a faster rise determined by the high frequency limit capacitance, followed by a much slower rise determined by the low frequency limit capacitance. As a result, signal delay is mainly determined by TSV capacitance at high frequency, and eye openings and power consumption are mainly determined by TSV capacitance at low frequency.

This behavior is confirmed both by numerical modeling and measurements which show the frequency dependent characterization of tungsten 2-bar TSVs (referred to as dual-TSVs). Both measurements and simulation confirm that the frequency dependent capacitance is a critical design factor for TSV high frequency applications.

In one embodiment, the static capacitance can be accurately estimated using the cylindrical capacitance model. The actual C0 value is lower due to the classical MOS capacitor effect. The evaluation of the latter requires low frequency measurements (at several MHz), in order to extract the silicon-oxide interface properties. The worst case of the MOS capacitor effect, however, can be evaluated analytically, based on general MOS capacitor theory. The low frequency capacitance $C_0$ can be treated as a series connection of the oxide capacitance and the capacitance due to the depletion layer: $C_0 = 1/(1/C_{ox}+1/C_d)$, causing the capacitance decrease, $C=1-C_0/C_{ox}=1/(1+C_d/C_{ox})$, where $C_d/C_{ox}=\in_{Si}/\in_{ox}*t_{ox}/x_d$. The silicon dielectric constant $\in_{Si}$ is approximately three times larger than that of the oxide $\in_{ox}$, the oxide thickness $t_{ox}$ is about 1 um, the upper limit of the depletion layer thickness $x_d$ is obtained when the potential reaches twice the Fermi (bulk) potential $\phi_F$, resulting in $x_d \leq x_{dmax}=(2*\in_{Si}*(2*\phi_F)/(q*N_a))^{1/2}=0.66$ um; where $N_a \sim 1E15$ cm$^{-3}$ is the doping level in the bulk of the silicon, and q is the electron charge. Finally, $C \leq 18\%$. Thus, the depletion effect is relatively small, compared to the substrate induced frequency dependent capacitance dispersion: as can be seen in FIGS. 9, 10, 11 $C_0/C_\infty$ can reach 10.

The frequency dependent behavior of the Y element is modeled using the multi-segment CG network shown in FIG. 8 based on theoretical considerations for the frequency independent filter network component calculation, as provided below.

$$C_{lf}=C_{ox}+C_{oxo}$$

$$C_{hf}=(C_{ox}^{-1}+C_{si}^{-1})^{-1}+C_{oxo}$$

$$G_{lf}=0$$

$$G_{hf}=1/\tau*C_{si}(1+C_{si}/C_{ox})^2$$

$$Gsi/Csi=\sigma(Si)/\in(Si)$$

Where Cox, Csi, Coxo and Gsi are derived from the above equations based on $C_{lf}$, $C_{hf}$ and $G_{hf}$ which can be obtained from analytical or numerical estimation. These values are sufficient to determine a $1^{st}$ order Y element (n=1) which describes the full bandwidth behavior of Y(f) asymptotically correctly. Any additional value of {C(f), G(f)} at an intermediate frequency allows to increase the order of the Y element by one thereby increasing the modeling accuracy.

As shown in the above equations, the explicit expressions for the network components consider strong frequency dependent silicon substrate induced dispersion and loss effects discussed above.

The Y element of the mini-C4 follows the same approach, except that we have a good underfill dielectric instead of the lossy silicon, which means that the conductance G becomes insignificant, and resulting capacitance C becomes frequency independent.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of designing an integrated circuit, said method comprising:
defining a preliminary design of said integrated circuit;

identifying, by using a computer, critical vertical interconnects in said preliminary design;

defining vertical transmission line model to represent each critical vertical interconnect, said transmission line model based on a closed environment;

defining a layout design of the integrated circuit, comprising circuit components and parameters thereof, using said preliminary design and said transmission line model for each critical vertical interconnect; and extracting circuit component parameters from the layout design for simulation of the design using the extracted circuit component parameters; wherein said closed environment of a design structure comprises a design fragment including the core structure itself and one or more additional design elements which affect its electrical behavior such that the whole fragment is represented and simulated by a standalone, independent model of the core structure in a real design environment.

2. The method according to claim 1, wherein said transmission line model represents frequency dependent behavior of said vertical interconnects utilizing multi-segment RLC scalable filter networks.

3. The method according to claim 1, wherein said transmission line model comprises a signal TSV model.

4. The method according to claim 1, wherein said transmission line model comprises a signal micro-bump model.

5. The method according to claim 1, wherein a modeling methodology of said design method is based on dividing an electromagnetic problem into at least a serial magnetic problem for calculating a Z-element including resistance R and inductance L components.

6. The method according to claim 5, wherein said Z element is modeled using a multi-segment filter RL network.

7. The method according to claim 1, wherein a modeling methodology of said design method is based on dividing an electromagnetic problem into at least a parallel electric problem for calculating a Y-element including capacitance C and conductance G components.

8. The method according to claim 7, wherein said Y element is modeled using a multi-segment CG network.

9. The method according to claim 1, wherein the diameter of a TSV and micro-bump is significantly smaller than the shortest wavelength in a given signal bandwidth.

10. An integrated circuit design system, comprising a memory in communication with a processor device configured for:

defining a preliminary design of said integrated circuit;

identifying critical vertical interconnects in said preliminary design;

defining a vertical transmission line model to represent each critical vertical interconnect, said transmission line model based on a closed environment;

defining a layout design of the integrated circuit, comprising circuit components and parameters thereof, using said preliminary design and said transmission line model for each critical vertical interconnect; and extracting circuit component parameters from the layout design for simulation of the design using the extracted circuit component parameters; wherein said closed environment of a design structure comprises a design fragment including the core structure itself and one or more additional design elements which affect its electrical behavior such that the whole fragment is represented and simulated by a standalone, independent model of the core structure in a real design environment.

11. The system according to claim 10, wherein said transmission line model represents frequency dependent behavior of said vertical interconnects utilizing multi-segment RLC scalable filter networks.

12. The system according to claim 10, wherein said transmission line model comprises a signal TSV model.

13. The system according to claim 10, wherein said transmission line model comprises a signal micro-bump model.

14. The system according to claim 10, wherein a modeling methodology of said design method is based on dividing an electromagnetic problem into at least a serial magnetic problem for calculating a Z-element including resistance R and inductance L components.

15. The system according to claim 14, wherein said Z element is modeled using a multi-segment filter RL network.

16. The system according to claim 10, wherein a modeling methodology of said design method is based on dividing an electromagnetic problem into at least a parallel electric problem for calculating a Y-element including capacitance C and conductance G components.

17. The system according to claim 16, wherein said Y element is modeled using a multi-segment CG network.

18. The system according to claim 10, wherein the diameter of a TSV and micro-bump is significantly smaller than the shortest wavelength in a given signal bandwidth.

19. A computer program product comprising a non-transitory computer readable medium having embodied therein computer readable program code means for causing a computer to implement an integrated circuit design system, comprising:

defining a preliminary design of said integrated circuit;

identifying critical vertical interconnects in said preliminary design;

defining a vertical transmission line model to represent each critical vertical interconnect, said transmission line model based on a closed environment;

defining a layout design of the integrated circuit, comprising circuit components and parameters thereof, using said preliminary design and said transmission line model for each critical vertical interconnect; and extracting circuit component parameters from the layout design for simulation of the design using the extracted circuit component parameters; wherein said closed environment of a design structure comprises a design fragment including the core structure itself and one or more additional design elements which affect its electrical behavior such that the whole fragment is represented and simulated by a standalone, independent model of the core structure in a real design environment.

* * * * *